US006350641B1

(12) United States Patent
Yang

(10) Patent No.: US 6,350,641 B1
(45) Date of Patent: Feb. 26, 2002

(54) METHOD OF INCREASING THE DEPTH OF LIGHTLY DOPING IN A HIGH VOLTAGE DEVICE

(75) Inventor: Sheng-Hsiung Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/572,152

(22) Filed: May 17, 2000

(51) Int. Cl.[7] .......................................... H01L 21/8238

(52) U.S. Cl. ....................... 438/227; 438/228; 438/305

(58) Field of Search ................................ 438/223, 224, 438/227, 228, 231, 305, 161, 298, 301, 307

(56) References Cited

U.S. PATENT DOCUMENTS 4,574,467 A * 3/1986 Halfacre et al. .............. 29/571
4,590,665 A * 5/1986 Owens et al. ................. 29/571
5,270,240 A * 12/1993 Lee ............................. 437/52
5,349,225 A * 9/1994 Redwine et al. ............ 257/336
5,643,813 A * 7/1997 Acocela et al. ............... 437/43
5,929,493 A * 7/1999 Wu ............................ 257/369
5,933,740 A * 8/1999 Chapman .................... 438/303
5,998,272 A * 12/1999 Ishida et al. ................ 438/305
6,071,775 A * 6/2000 Choi et al. .................. 438/257

* cited by examiner

*Primary Examiner*—John F. Niebling
*Assistant Examiner*—Angel Roman
(74) *Attorney, Agent, or Firm*—Powell, Goldstein, Frazer & Murphy, LLP

(57) ABSTRACT

A method for fabricating a high vltage device with double diffusion structure provides a pad oxide layer on a silicon substrate. A silicon nitride layer is formed and patterned to expose isolation regions. A first mask covers the partial isolation regions spaced from the silicon nitride layer. A well region is formed underlay the silicon nitride layer. A second mask covers the partial isolation region spaced from the silicon nitride layer and the partial silicon nitride layer. First doped regions are formed underlay the partial silicon nitride layer. Then the isolation regions are formed partially on the first doped regions. Next, a third mask covers the pad oxide layer and the partial isolation regions and second doped regions are formed spaced from the first doped regions and below the isolation regions. A gate is formed and located between the first doped regions and a spacer on a side-wall thereof. Third doped regions are formed in the first doped regions.

20 Claims, 12 Drawing Sheets

METHOD OF INCREASING THE DEPTH OF LIGHTLY DOPING IN A HIGH VOLTAGE DEVICE

BACKGROUND OF THE INVENTION

1. Field of the Invention

Present invention relates to a fabrication method for a high voltage device, and especially relates to increasing the depth of N-type lightly doping in a high voltage device.

2. Description of the Prior Art

In the field of metal oxide semiconductors, the length of the channel will become shorter as the size of the device decreases, and the operation time will become shorter too. However, the length of channel of MOSFET cannot be shortened indefinitely, or else the short channel of device will result in some problems called "the short channel effect".

If we maintain the design parameters of a device, only reducing the channel length of MOS device, the depletion region in source/drain region produced during process will overlap the channel. As the length of the channel is shortened the channel gets closer to the depletion region width of the source/drain region of device, and the overlap between the source/drain region of device and the depletion region will become wider. The short channel will make control of the gate to channel worse. Besides, a partial channel be shared by the depletion region of source/drain region, so sub-threshold current will increase, and threshold voltage of device will be lowered.

If we further reduce the channel of the MOSFET to about 0.15 $\mu$m, PN junction between the channel and source/drain region of the device will be affected. Besides, this will increase the subthreshold current resulting from more electrons being injected into the channel from the source region. This will make the MOS become open or almost open while the gate voltage of NOMS is zero, and when advanced, it will lose the control to the MOS of the gate.

If the channel of MOSFET is reduced without lowering the operation voltage at the same time, this will enhance the electric field of the channel. The electric field near the drain region is stronger. This will reduce in electron/hole pair for the impact effect of electrons gained enough energy near the drain region, and the electron/hole pair will spoil the device. This is the "hot carrier effect." The hot carrier effect of electrons is more serious than the one of the hole, so the NMOSFET will suffer more problems.

Hot carrier effect becomes more serious as the channel of the MOSFET is further shortened. There are many methods to resolve this issue, and one of them is to lower the operation voltage of the MOSFET. If for example, the voltage is lowered from 5V to 2.5V, this will permit the electric field to become too weak to result in a hot carrier, and the hot carrier effect will be lessened effectively. Another method to lessen the hot carrier effect the so-called "lightly doped drain (LDD)". In such a way, we add a low concentration N-type region into portion region of the source/drain region of the MOSFET, and the region is near the channel of the device.

Some problem will be encountered when the high voltage (8~1000V) device is integrated in deep submicron process. In the high voltage NMOSFET device process, N-type LDD is used to lessen the hot carrier effect of high voltage devices and to increase breakdown voltage. However, in the traditional process, the N-type lightly doped drain step occurred after the poly step, thus the source/drain region is executed anneal only once and enough doping depth cannot be acquired. Besides, if we apply a multi-step high energy N-type lightly doped, this will effect throughput and cost.

Based on the former statement, a better integration process is needed to increase the anneal turns in identical process and then improve the profile and depth of N-type lightly doped region.

SUMMARY OF THE INVENTION

In accordance with the present invention, a method is provided for solving problems in a traditional high voltage device process.

It is another object of this invention to lessen the hot carrier effect of high voltage device and to increase operating voltage of a high voltage device.

It is a further object of this invention to form a better N-type lightly doped profile and depth to improve throughout and cost.

A method for fabricating a high voltage device with double diffusion structures provides a pad oxide layer on a silicon substrate. A silicon nitride layer is formed and patterned to expose isolation regions. A first mask covers the partial isolation regions spaced from the silicon nitride layer. A well region is formed underlay the silicon nitride layer. A second mask covers the partial isolation regions spaced from the silicon nitride layer and the partial silicon nitride layer. First doped regions are formed underlay the partial silicon nitride layer. Then the isolation regions are formed partially on the first doped regions. Next, a third mask covers the pad oxide layer and the partial isolation regions and second doped regions are formed spaced from the first doped regions and below the isolation regions. A gate is formed and located between the first doped regions and a spacer on a side-wall thereof. Third doped regions are formed in the first doped regions.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

One of high voltage device processes of the present invention may be recognized by referring FIG. 1A to FIG. 1G. First referring to FIG. 1A, a silicon substrate 10 is provided. A pad oxide layer 12 is then formed on silicon substrate 10, and a silicon nitride layer 13 is deposited on pad oxide layer 12.

Figure 1A:
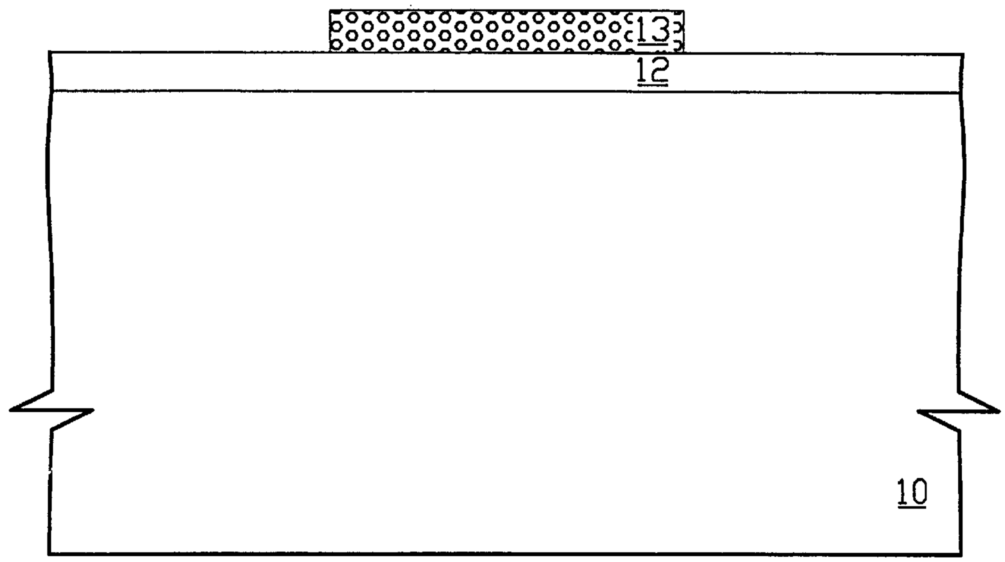
FIGS. 1A to 1G are schematic representations of high voltage MOSFET device process.
Figure 1B:
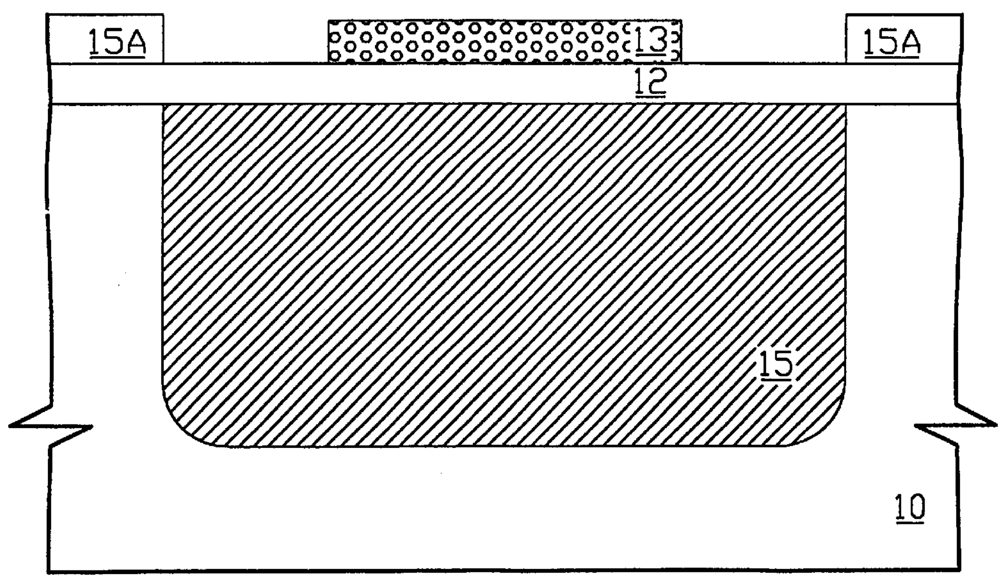
Figure 1C:
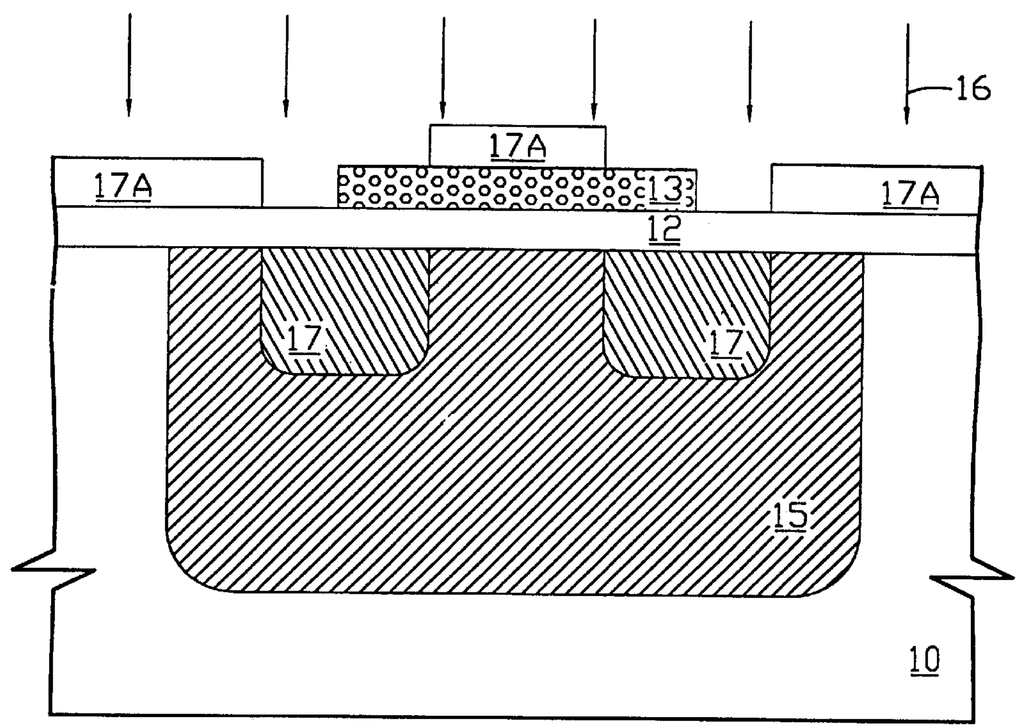

Then, referring to FIG. 1B, ions of a first conductivity 14 are implanted using a photoresist layer 15A as a mask to form the P-well 15, with an implanting concentration of about $10^{12}$~$3\times10^{13}$ atoms/cm$^2$ and an implanting voltage is about 120~200 KeV. Consequentially, and referring to FIG. 1C, ions of a second conductivity 16 are implanted using a photoresist layer 17A as a mask to form the N-type lightly doped region 17, having an implant concentration about $7\times10^{12}$~$5\times10^{13}$ atoms/cm$^2$ and the implanting voltage of about 100~180 KeV.

Figure 1D:
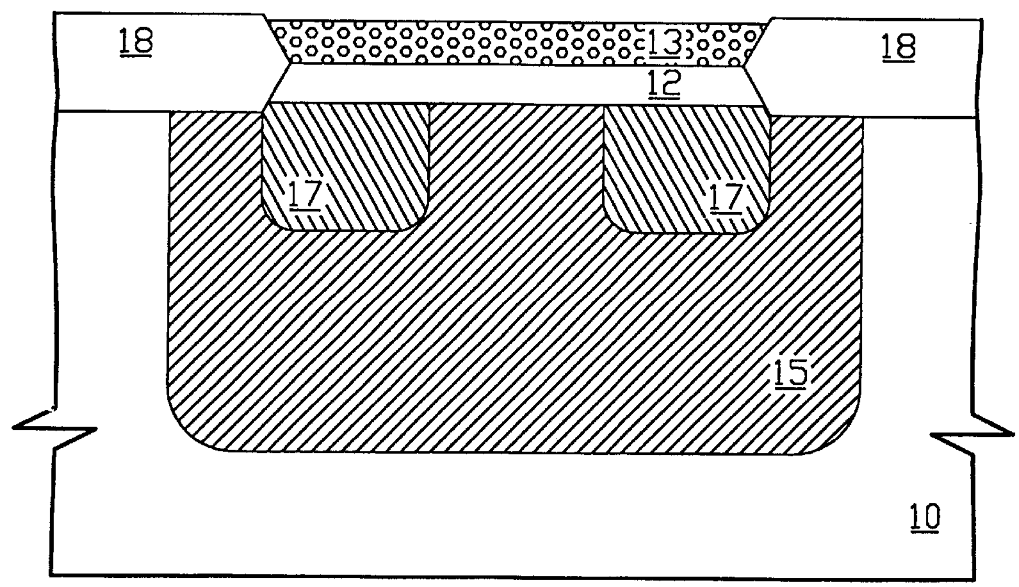
Figure 1E:
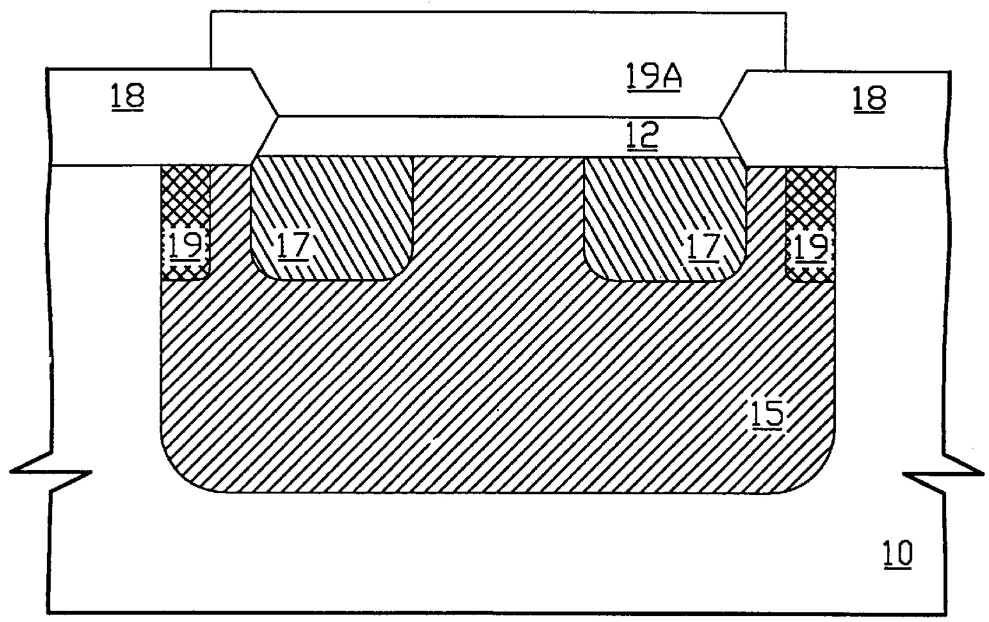

Thermal oxidation is oxidated using the silicon nitride layer 13 as a mask to form the field oxide 18, as FIG. 1D shows. Then referring to FIG. 1E, removing silicon nitride layer 13 and consequentially implanting ions by using a photoresist layer 19A as a mask to form P-type field 19.

Figure 1F:
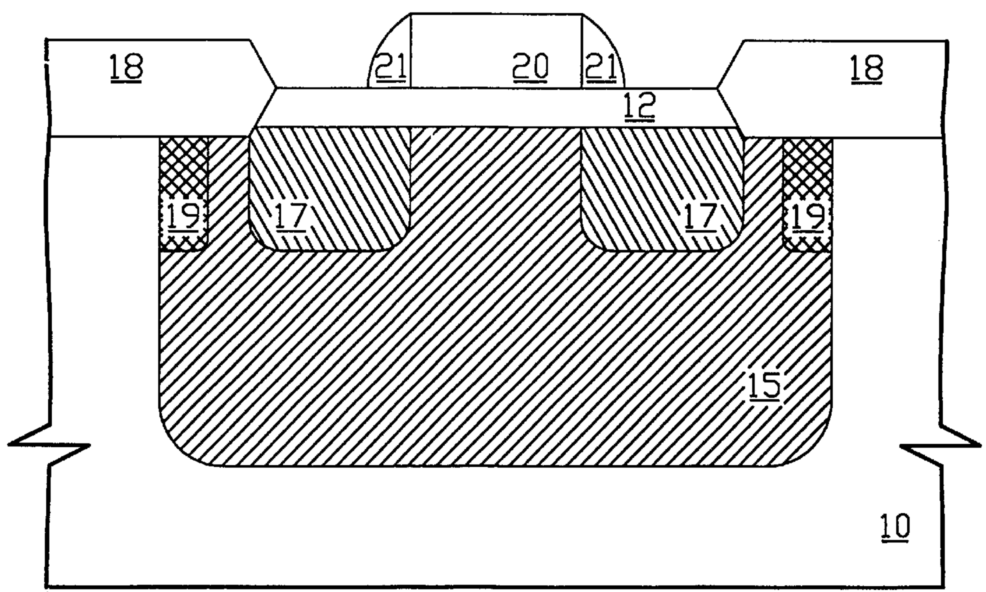
Figure 1G:
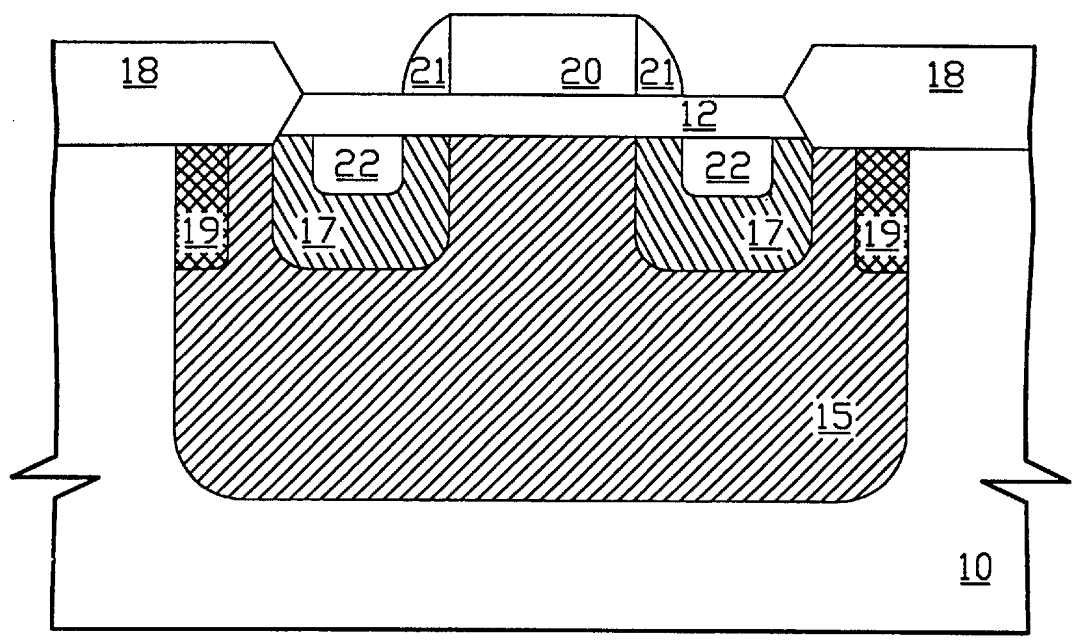

Ions are implanted to form the P-type field, then referring to FIG. 1F, a gate 20 is formed on pad oxide layer 12 and consequentially spacers 21 are formed on the side of gate 20. Finally, referring to FIG. 1G, forming a high concentration N-type doped region 22 is formed in N-type lightly doped region 17 using the spacers 21 of gate 20 and field oxide 18 as masks, and then an anneal process of source/drain region is executed.

Another high voltage device processes of the present invention is illustrated in FIG. 2A to FIG. 2H. First referring to FIG. 2A, a silicon substrate 30, is first provided and a pad oxide 32 is formed on the silicon substrate 30 and then depositing a silicon nitride layer 33 is deposited on pad oxide layer 32.

Figure 2A:
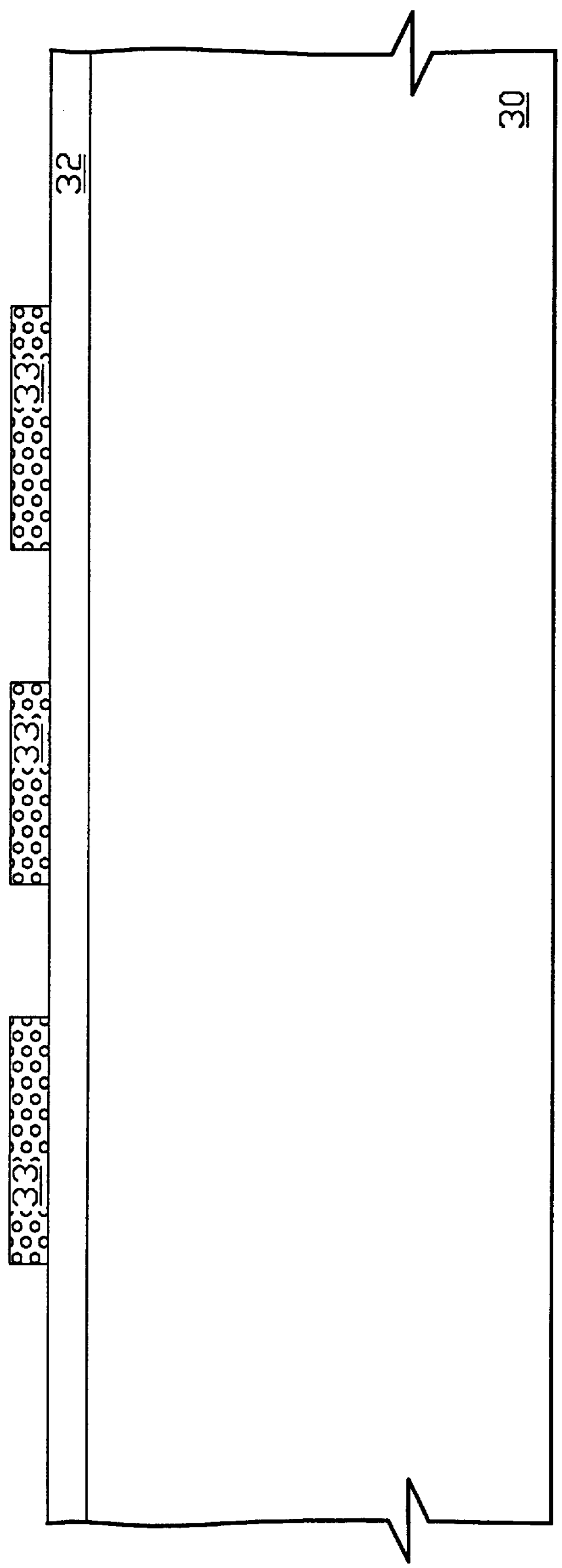
FIGS. 2A to 2H are schematic representations of another high voltage MOSFET device process.
Figure 2B:
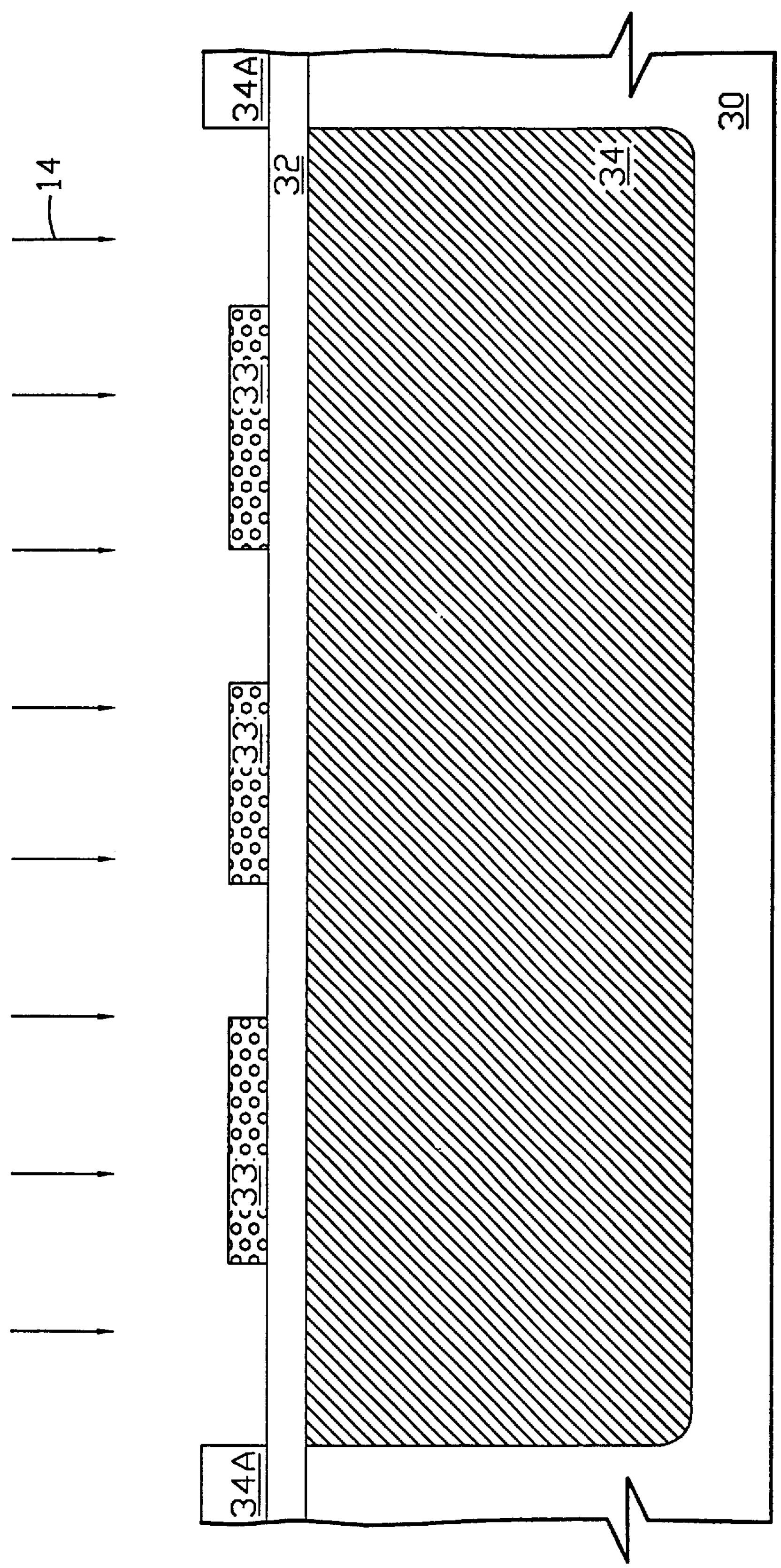
Figure 2C:
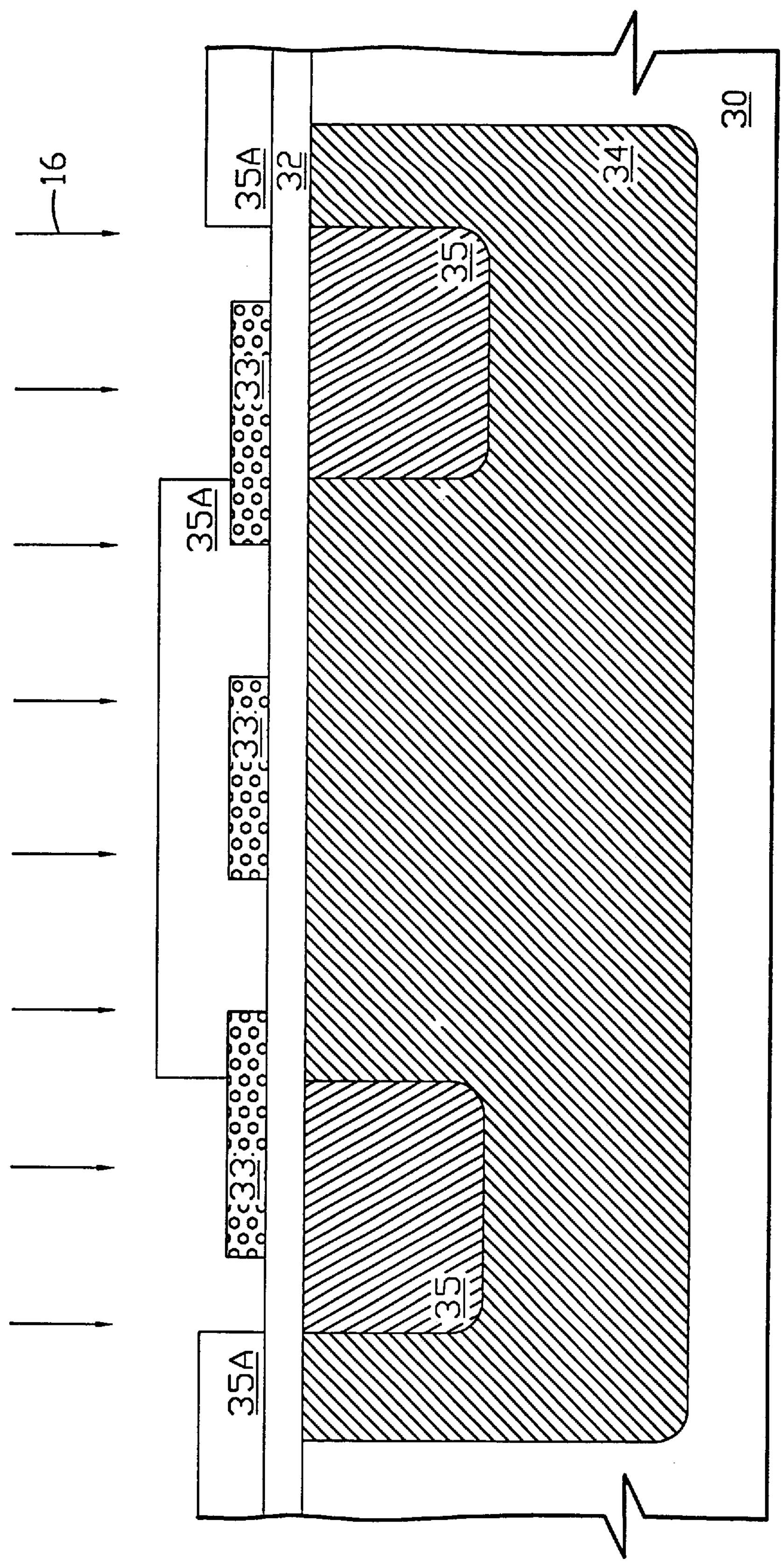
Figure 2D:
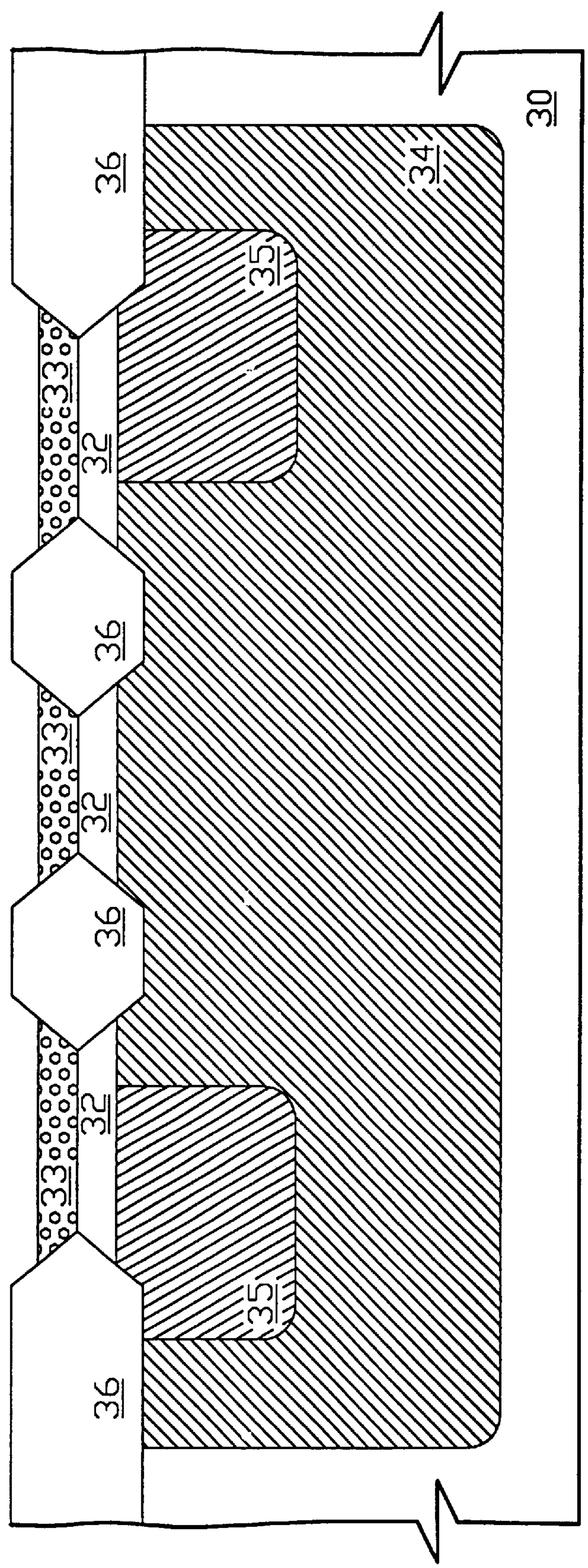
Figure 2E:
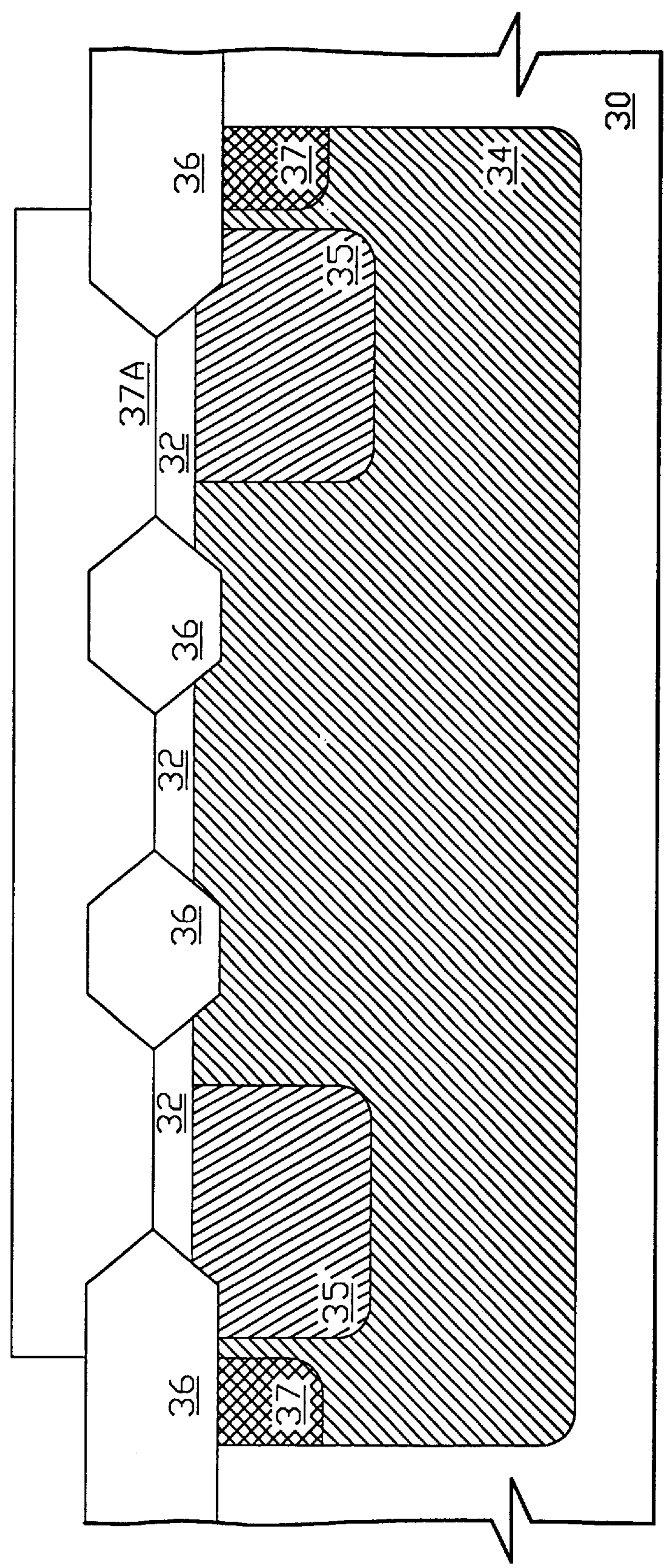

Now referring to FIG. 2B, ions of a first conductivity 14 are implanted using a photoresist layer 34A as a mask to form the P-well 34, in which the implanting concentration is about $10^{12}$~$3\times10^{13}$ atoms/cm$^2$ and the implanting voltage is about 120~200 KeV. Consequentially, referring to FIG. 2C, implanting ions of a second conductivity 16 are implanted by a photoresist layer 35A as a mask to form the N-type lightly doped region 35, in which the implanting concentration is about $7\times10^{12}$~$5\times10^{13}$ atoms/cm$^2$ and the implanting voltage is about 100~180 KeV. Then thermal oxidation is executed using silicon nitride layer 33 as a mask to form the field oxide 36, as FIG. 2D shows. Then referring to FIG. 2E, removing silicon nitride layer 33 is removed and ions are consequentially implanted using a photoresist layer 37A as a mask to form P-type field 37.

Figure 2F:
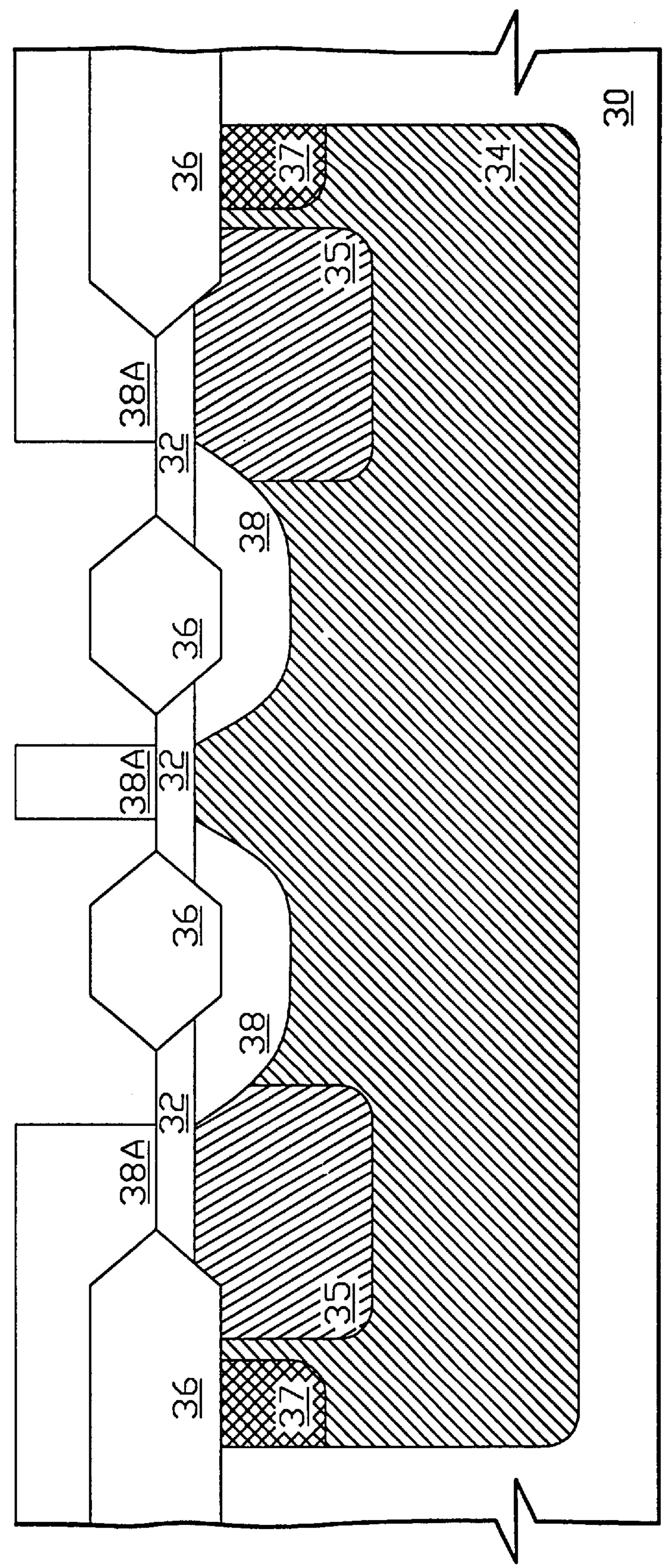
Figure 2G:
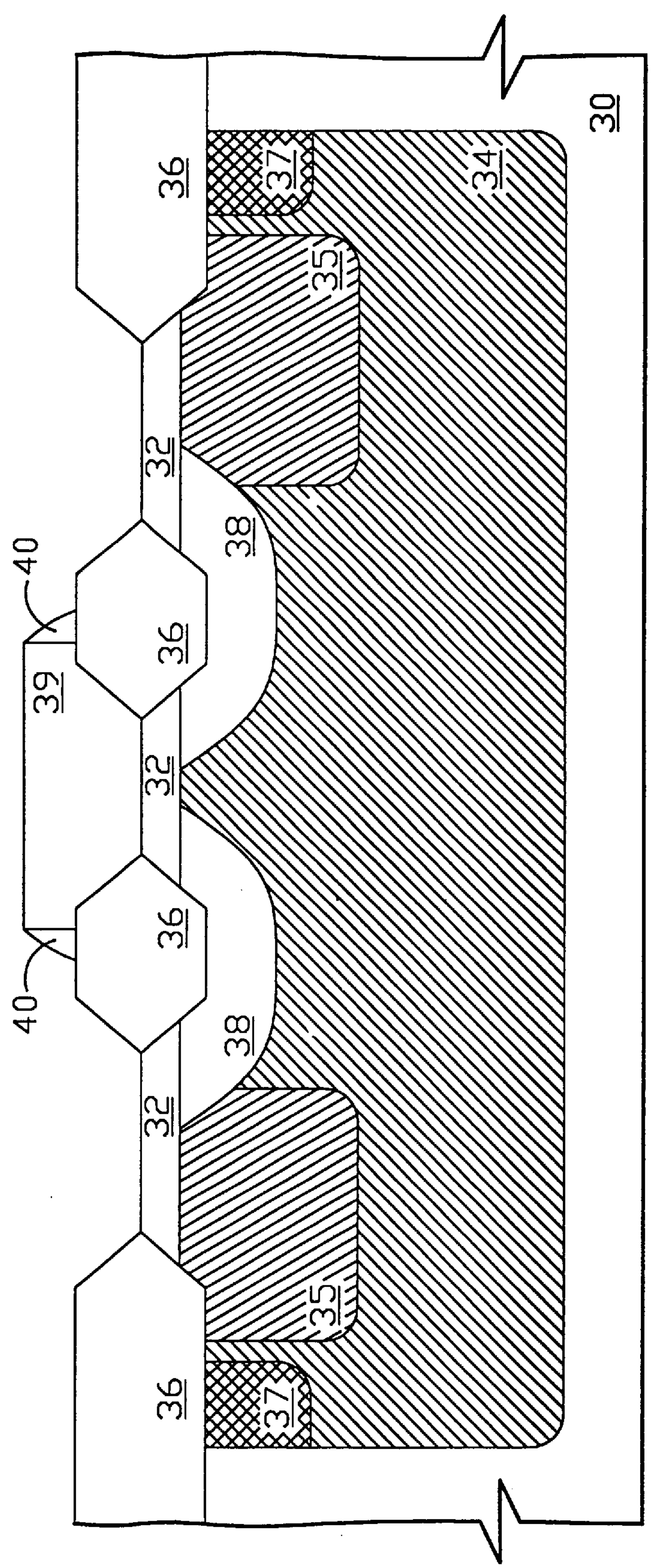

Consequentially, and referring to FIG. 2F, the N-field 38 is formed by the photoresist layer 38A as a mask. Then, referring to FIG. 2G, a gate 39 is formed on pad oxide 32, and the spacer 40 is formed on the two sides of gate 39.

Figure 2H:
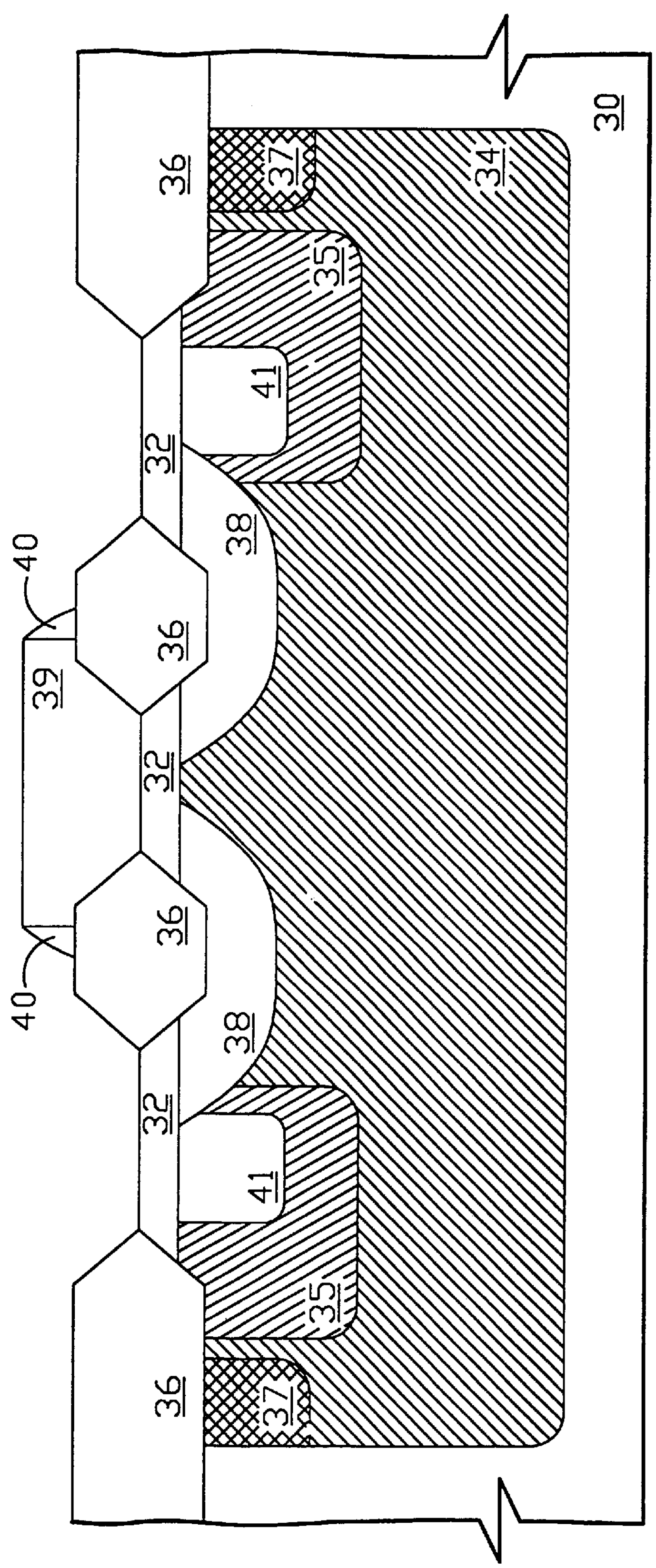

Finally, referring to FIG. 2H, a high concentration N-type doped region 41 is formed in N-type lightly doped region 35 by the spacers 40 of gate 39 and field oxide 36 as masks and then an anneal process of the source/drain region is executed.

Although specific embodiments have been illustrated and described, it will be obvious to those skilled in the art that various modifications may be made without departing from what is intended to be limited solely by the appended claims.

What is claimed is:

1. A method for fabricating a high voltage device with a plurality of double diffusion structures, wherein said method comprises:

providing a silicon substrate;

forming a pad oxide layer on said silicon substrate;

forming a silicon nitride layer on said pad oxide layer, and patterning said silicon nitride layer to expose a plurality of respective isolation regions;

forming a first mask to partially cover said isolation regions spaced from said silicon nitride layer;

implanting ions of a first conductivity into said substrate to form a well region underlay said silicon nitride layer and partially extending to said isolation regions adjacent to said silicon nitride layer;

removing said first mask;

forming a second mask to partially cover said isolation regions spaced from said silicon nitride layer and said silicon nitride layer;

implanting ions of a second conductivity into said well region to form a plurality of first doped regions spaced from each other, said first doped regions in said well region and underlay partial said silicon nitride layer;

removing said second mask;

executing thermal oxidation to form said isolation regions, wherein said first doped regions are partially below said isolation regions;

removing said silicon nitride layer to expose said pad oxide layer;

forming a third mask to cover said pad oxide layer and partially said isolation regions;

implanting ions of said first conductivity into said well to form a plurality of second doped regions spaced from said first doped regions and below said isolation regions;

forming a gate on said pad oxide layer, wherein said gate is located between said first doped regions;

forming a spacer on a side-wall of said gate;

implanting ions of said second conductivity into said first doped regions to form a plurality of third doped regions on said first doped regions; and annealing said third doped regions to increase a depth of said first doped regions.

2. The method according to claim 1, wherein said high voltage device is an N-type metal oxide semiconductor.

3. The method according to claim 1, wherein said high voltage device is a P-type metal oxide semiconductor.

4. The method according to claim 1, wherein said ions of a first conductivity are boron.

5. The method according to claim 4, wherein said boron ions are implanted at a voltage of about 120–200 KeV.

6. The method according to claim 4, wherein a concentration of said implanted boron ions is about $10^{12}$–$3\times10^{13}$ atoms/cm$^2$.

7. The method according to claim 1, wherein said ions of a second conductivity are phosphorous.

8. The method according to claim 7, wherein said phosphorous ions are implanted at a voltage of about 120–200 KeV.

9. The method according to claim 7, wherein a concentration of implanted phosphorous ions is about $10^{12}$–$3\times10^{13}$ atoms/cm$^2$.

10. The method according to claim 1, wherein said gate is made of polysilicon.

11. A method for fabricating a high voltage device, wherein said method comprises:

providing a silicon substrate;

forming a pad oxide layer on said silicon substrate;

forming a silicon nitride layer on said pad oxide layer, and patterning said silicon nitride layer to expose a plurality of respective isolation regions;

forming a first mask to partially cover said isolation regions spaced from said silicon nitride layer;

implanting ions of a first conductivity into said substrate to form a well region underlay said silicon nitride layer and extended to said isolation regions adjacent to said silicon nitride layer;

removing said first mask;

forming a second mask to partially cover said isolation regions spaced from said silicon nitride layer and said silicon nitride layer;

implanting ions of a second conductivity into said well region to form a plurality of first doped regions spaced from each other, said first doped regions in said well region and underlay said silicon nitride layer;

removing said second mask;

executing thermal oxidation to form said isolation regions, wherein a first isolation device and a second isolation device are located between said first doped regions;

removing said silicon nitride layer to expose said pad oxide layer;

forming a third mask to cover said pad oxide layer, partially said isolation regions, said first isolation device and said second isolation device;

implanting ions of said first conductivity into said well to form a plurality of second doped regions spaced from said first doped regions and below said isolation regions;

removing said third mask;

forming a fourth mask, said fourth mask exposing said first isolation device, said second isolation device, and partially said pad oxide layer;

implanting ions of said second conductivity to form a plurality of third doped regions spaced from each other, said third doped regions underlay said first isolation device and said second isolation device, said third doped regions adjacent to said first doped regions;

forming a gate on said pad oxide layer, wherein a portion of said gate is located above said first isolation device and said second isolation;

forming a spacer on a side-wall of said gate;

implanting ions of said second conductivity to form a plurality of fourth regions in said first doped region and adjacent to said third doped regions; and annealing said high voltage device to increase a depth of said first doped regions.

12. The method according to claim 11, wherein said high voltage device is an N-type metal oxide semiconductor.

13. The method according to claim 11, wherein said high voltage device is a P-type metal oxide semiconductor.

14. The method according to claim 11, wherein said ions of said first conductivity are boron.

15. The method according to claim 14, wherein said boron ions are implanted at a voltage of about 120–200 KeV.

16. The method according to claim 14, wherein concentration of the implanted boron ions is about $10^{12}$–$3\times10^{13}$ atoms/cm$^2$.

17. The method according to claim 11, wherein said ions of said second conductivity are phosphorous.

18. The method according to claim 17, wherein said phosphorous ions are implanted at a voltage of about 120–200 KeV.

19. The method according to claim 18, wherein concentration of the implanted phosphorous ions is about $10^{12}$–$3\times10^{13}$ atoms/cm$^2$.

20. The method according to claim 11, wherein said gate comprises poly silicon.

* * * * *